United States Patent [19]

Brooks

[11] Patent Number: 6,144,210

[45] Date of Patent: Nov. 7, 2000

[54] METHOD AND APPARATUS FOR FINDING AND LOCATING MANUFACTURING DEFECTS ON A PRINTED CIRCUIT BOARD

[75] Inventor: Leslie M. Brooks, West Melbourne, Fla.

[73] Assignee: ZEN Licensing Group, LLP, Atlanta, Ga.

[21] Appl. No.: 09/328,735

[22] Filed: Jun. 9, 1999

Related U.S. Application Data

[60] Provisional application No. 60/088,556, Jun. 9, 1998.

[51] Int. Cl.[7] .......................... G01R 31/08; G01R 31/312
[52] U.S. Cl. .......................... 324/519; 324/527; 324/537
[58] Field of Search .................................. 324/512, 519, 324/527, 528, 531, 537

[56] References Cited

U.S. PATENT DOCUMENTS

| | | | |
|---|---|---|---|
| 5,124,660 | 6/1992 | Cilingiroglu | 324/538 |
| 5,254,953 | 10/1993 | Crook et al. | 324/538 |
| 5,256,975 | 10/1993 | Mellitz et al. | 324/519 |
| 5,268,645 | 12/1993 | Prokoff et al. | 324/537 |
| 5,363,048 | 11/1994 | Modlin et al. | 324/519 |

*Primary Examiner*—Glenn W. Brown
*Attorney, Agent, or Firm*—Troutman Sanders LLP; Wm. Brook Lafferty

[57] ABSTRACT

A method and apparatus for detection of manufacturing defects during in-circuit testing. A preferred embodiment utilizes an onboard controllable signal source and/or an external signal source, in combination with capacitive sensors, to detect defects. In an embodiment of the present invention, prediction equations are implemented to increase both the efficiency and effectiveness of defect detection and location.

17 Claims, 6 Drawing Sheets

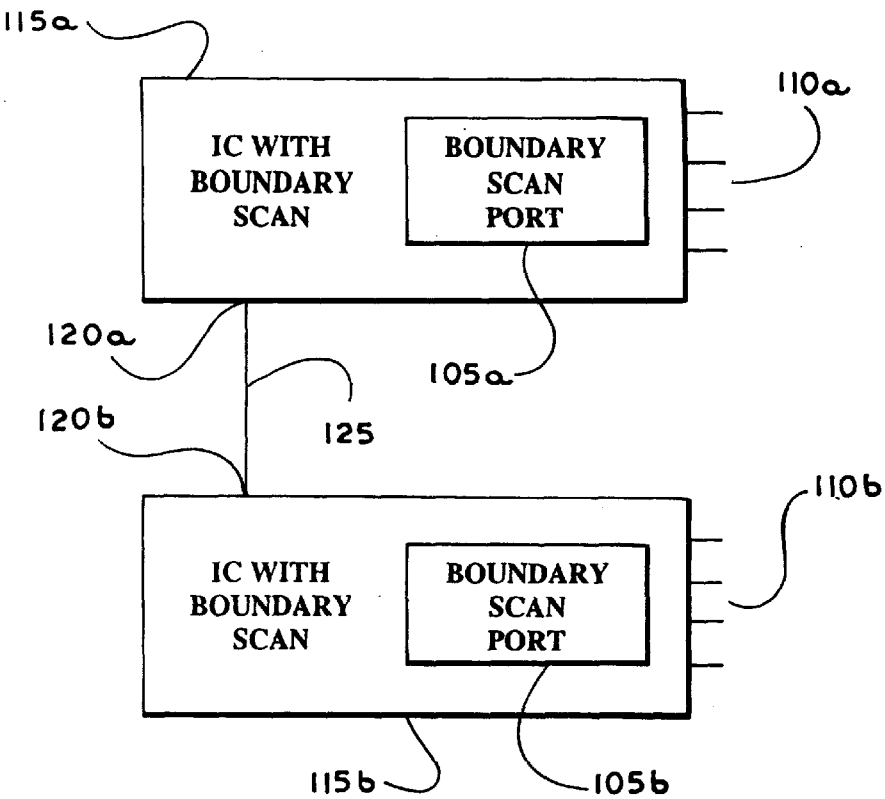
Fig_1 PRIOR ART
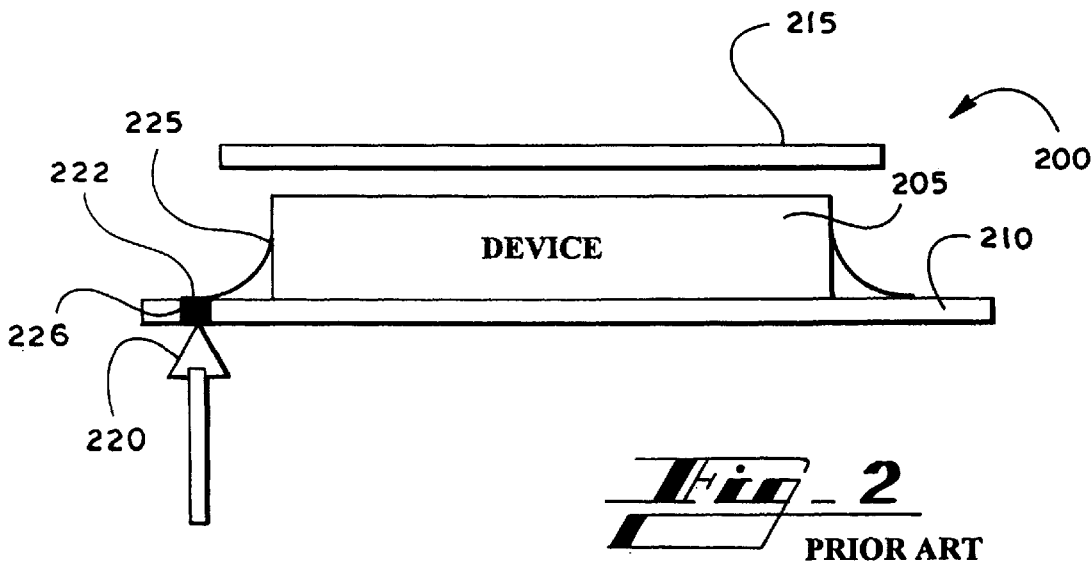
Fig_2 PRIOR ART

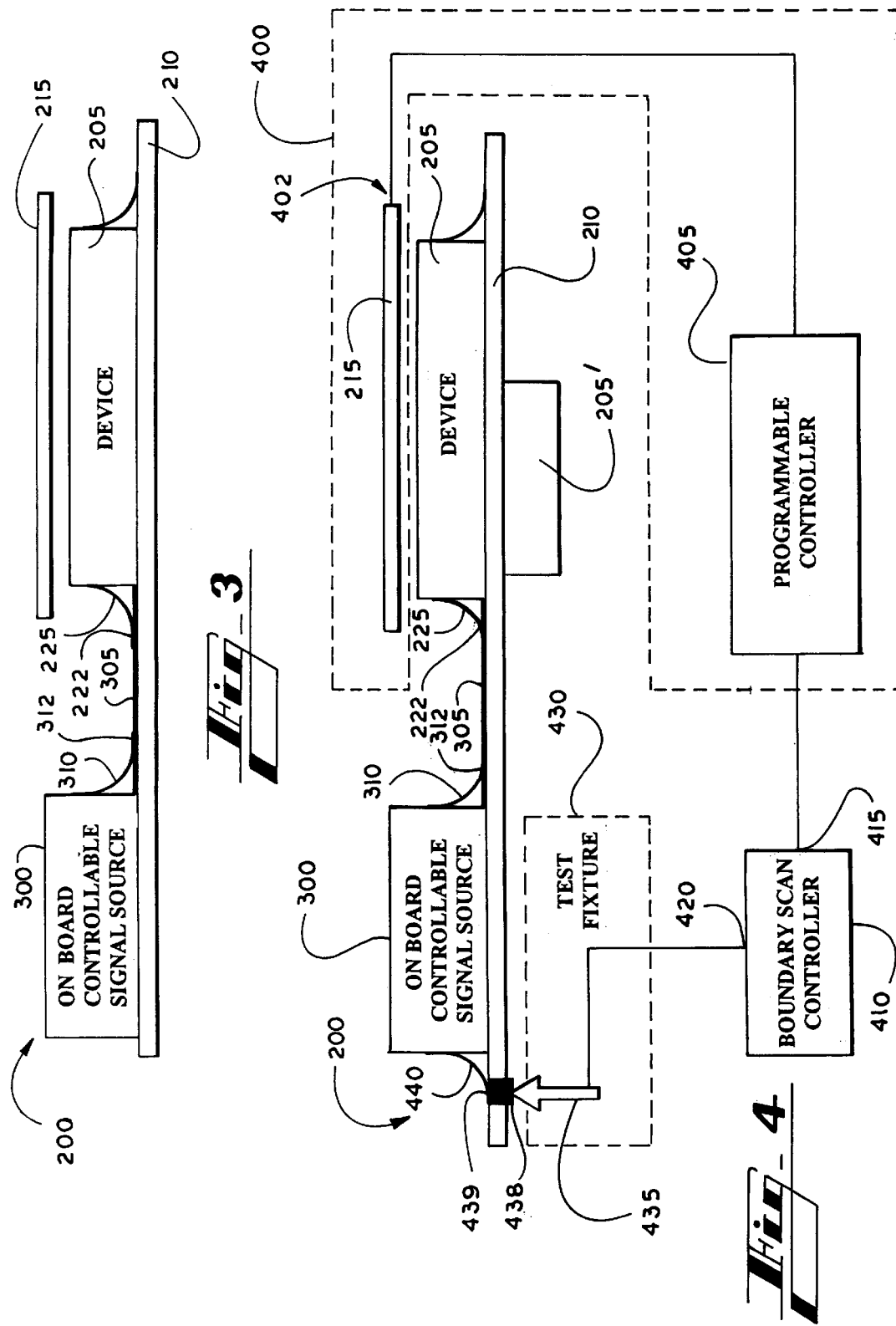

METHOD AND APPARATUS FOR FINDING AND LOCATING MANUFACTURING DEFECTS ON A PRINTED CIRCUIT BOARD

RELATED APPLICATION

This application claims the benefit of U.S. Provisional Application Ser. No. 60/088,556, filed Jun. 9, 1998.

FIELD OF THE INVENTION

This invention generally relates to in-circuit testing devices and, more particularly described, relates to testing for shorts and other manufacturing defects between wire traces or circuit nodes of a PCB, or pins of devices mounted on a populated circuit assembly, by means of an onboard controllable signal source and/or an external signal source, combined with capacitive sensors.

BACKGROUND

The world of electronics is an ever-shrinking world. The physical space needed and/or allocated to implement a given function is getting smaller and smaller. The use of dual-sided, multi-layer printed circuit boards with miniature surface mount technology (SMT) components and custom application-specific integrated circuits (ASICs) installed thereon to form small, compact, printed circuit assemblies is now common. The spacing between the pins of components becomes smaller as the designs are made to fit into smaller physical configurations. The physical spacing, such as pin spacing and wire trace spacing, is further reduced when the assembly is intended to be portable, such as a modem designed to support the Personal Computer Memory Card International Association (PCMCIA) standard.

In the context of such a crowded and densely populated printed circuit assembly, it is often difficult to determine if an electronic device or component has been installed correctly. More particularly stated, it is often difficult to determine whether there are any shorts between the wire traces or nodes of the PCB, the pins or leads of the installed device or component, and other wire traces, circuit nodes, pins or leads (hereinafter "nodes"). Historically, such determinations have been made by one or a combination of three testing methodologies: "Bed of nails" testing, boundary scan testing and capacitive testing.

"Bed of Nails" Testing

One method of testing a printed circuit assembly involves use of a "bed of nails" test fixture with a conventional in-circuit tester, such as an HP 3070 Board Tester manufactured and distributed by the Hewlett-Packard Company of Palo Alto, Calif. The bed of nails test fixture provides a number of contact probes for accessing points on the printed circuit assembly. There must be contact between the probes of the fixture and a device on the printed circuit assembly or signal paths on the printed circuit assembly (typically via a conventional test point access node) for the test method to work. The method is often called a "bed of nails" testing method because the probes are typically sharp metal contact probes configured so that the printed circuit assembly can be placed on the "bed of nails" and tested. In this manner, the probes touch or access various parts of the device or the signal paths on the printed circuit assembly (via the test point access nodes on the printed circuit assembly) and thereby allow measurements to be made on the device.

Typically, the in-circuit tester measures the resistance between all possible pairs of probes. Measurements from the probes are then compared to "correct" values to determine whether there are any shorts. However, the appropriate signal path must be in physical contact with the test probes for this testing method to work. Densely populated printed circuit assemblies often have inaccessible signal paths, such as wire traces beneath multiple layers on the printed circuit board assembly, thereby hampering the use of such a "bed of nails" test fixture. Therefore, "bed of nails" test fixtures are often ineffective when attempting to test a densely populated printed circuit assembly. In particular, those nodes without probe access cannot be tested for shorts by this method.

Boundary Scan

Those skilled in the art will be familiar with Boundary Scan, which is another test method for determining proper connectivity. Boundary Scan (illustrated in FIG. 1 as prior art and also known as IEEE 1149.1 or Joint Test Action Group (JTAG)) is a specialized non-contact test method for testing the board-level interconnections among devices on a printed circuit assembly. More particularly, Boundary Scan is a special form of conventional scan path testing that is implemented around every input/output pin of a device in order to provide controllability and observability of the input/output pin values during testing.

Referring now to FIG. 1, the Boundary Scan method generally uses a set of four pins 110a, 110b for each device 115a, 115b. These pins allow an in-circuit tester (not shown) to gain access to all of the pins on the device 115a, 115b. The in-circuit tester (not shown) typically sends commands to a boundary scan port 105a within the device 115a in order to read or control the input pins and the output pins on the device 115a. Those skilled in the art will realize that while the boundary scan port 105a is typically implemented within the circuitry of the device 115a, the boundary scan port 105 a may also be implemented as a separate circuit. FIG. 1 merely shows the boundary scan ports 105a, 105b implemented within the circuitry of the devices 115a, 115b in order to avoid confusion.

Boundary Scan is most advantageous when a printed circuit assembly 100 has several interconnected devices 115a, 115b which implement it. This is advantageous because it is then possible to use, for example, port 105a, to generate an output on one pin 120a and read it from a connected pin 120b on another device 115b via, for example, port 105b, without having physical access to either of the pins 120a, 120b or the signal path 125 between the pins 120a, 120b. This is particularly advantageous because the same pins and signal paths which are used for Boundary Scan testing are later used to create the normal function of the circuit during normal operation. The term "normal operation" is used to describe the operation of the completed circuit assembly by the consumer or end user in the manner intended by the designer.

The digital version of Boundary Scan is more formally defined by the Institute of Electrical and Electronics Engineers, Inc. (IEEE) and the published IEEE standard 1149.1 (1990). The analog version of Boundary Scan is more currently being defined as IEEE 1149.4 (1997). Additional information regarding Boundary Scan is available by referring to the published IEEE 1149.1 standard, which is available from IEEE, Inc., New York, N.Y. Furthermore, while still not in a final form, information regarding the preliminary IEEE 1149.4 Boundary Scan standard is also available from IEEE, Inc., New York, N.Y.

While Boundary Scan testing allows testing of interconnected devices without accessing the pins of the interconnected devices, one skilled in the art will appreciate that such testing is not useful in all situations. For example, Boundary Scan testing is less useful where there is only one device implementing Boundary Scan and that device is surrounded by devices that do not implement or support Boundary Scan testing. In such a situation, it is often necessary to access many of the pins or signal paths on the printed circuit assembly with a probe. Thus, it may still be difficult to test the integrity of connections of a device on a populated printed circuit assembly using Boundary Scan.

Additional limitations of Boundary Scan are evident with reference to the faulty circuits depicted in FIGS. 4 and 5. If pin 401.1 is tested by Boundary Scan, then the short can be detected if either of pins 401.1 or 401.2 are an output pin (or a bidirectional pin) and the other is an input pin (or a bidirectional pin). However, the Boundary Scan configuration cannot detect the short if both pins are output pins or both pins are input pins, and if IC 402 and 403 do not support Boundary Scan. Referring now to FIG. 5, if pin 501.1 is tested by a Boundary Scan system, then the short can be detected if either of the pins 501.1 and 501.2 is an output pin (or a bidirectional pin) and the other is an input pin (or a bidirectional pin). However, the Boundary Scan configuration cannot detect the short if both pins 501.1 or 501.2 are output pins or both pins are input pins, and if IC 502 does not support Boundary Scan.

An additional limitation of Boundary Scan is that it is good at detecting open connections between devices which support Boundary Scan, but it is less effective at detecting shorts. In particular, it may often fail to detect shorts of the type later shown in FIG. 6, where the short joins together two devices which support Boundary Scan with two devices which do not.

For instance, FIG. 6 illustrates yet another type of short between nodes on a PCB. In the diagram IC 601, IC 602, IC 603, and IC 604 each has a capacitive sensor (not shown) positioned proximately near them so as to detect any test signal coupled to a node associated with that IC, as will be discussed subsequently in reference to capacitive testing. There is a short between IC 601 pin one (601.1) and IC 603 pin 1 (603.1), and 603.1 cannot be accessed by a test probe. In prior systems, this short would not be detected by a bed-of-nails tester, because there is no probe access to pin 603.1. With prior methods, this short might not be detected.

Capacitive Testing

Another testing method for testing the integrity of a device's connections is capacitive testing. An example of such capacitive testing is described in U.S. Pat. No. 5,254,953 (hereinafter "the '953 patent") entitled "Identification of Pin-Open Faults by Capacitively Coupling Through the Integrated Circuit Package" and assigned to the Hewlett-Packard Company of Palo Alto, Calif. In the '953 patent, a system is described for determining whether pins of a device are properly soldered to a printed circuit board assembly. FIG. 2 illustrates such a prior art system.

Referring now to FIG. 2, a printed circuit assembly 200 has an integrated circuit device 205 mounted to a printed circuit board 210. A capacitive sensor 215 is positioned over the device 205 while a test probe 220 contacts a pin under test 225 via a pad 226 and a connection 222 between the pin 225 and the pad 226.

In a capacitive testing process disclosed in the '953 patent, the test probe 220 typically injects an alternating current (AC) test signal (such as a 10 kHz signal at 0.2 volts) into the pad 226 connected to the pin under test 225. The capacitive sensor 215 then detects this test signal via the capacitive coupling between the pin 225 and the bottom of the capacitive sensor 215 and converts the AC signal to an intermediate signal called a detection signal. The value of the detection signal is proportional to the detected amplitude of the AC signal. In this manner, the value of the detection signal from the capacitive sensor 215 may be compared to a threshold value to determine characteristics about the detected AC signal (such as the strength of the AC signal). If the pin 222 between the test pad 226 and pin under test 225 is open, the value of the detection signal will be much smaller than anticipated. An in-circuit tester (not shown) connected to the capacitive sensor 215 then indicates that the printed circuit assembly 200 has failed the test and declares that the pin under test 225 is open.

While the capacitive testing process described in the '953 patent allows testing to detect open pins on populated printed circuit boards, a test probe is still required to provide the test signal. Moreover, test probe access to the pin under test must still be available for capacitive testing as described in the '953 patent to work. Such a capacitive testing process would be ineffective in a circuit assembly where test probe access to the pin under test is not available, such as a densely populated circuit assembly where the pin spacing and wire trace spacing are extremely small.

It is well known that capacitive testing can detect shorts to non-probed pins under certain conditions. Referring, for instance, to the faulty circuit depicted, for illustrative purposes, in FIG. 4, capacitive testing can detect the short between a probed pin of IC 401 and a non-probed pin of IC 401 under two conditions. First, if the non-probed pin is floating, and thus does not decrease the signal level of the AC test signal driven into the probed pin, then the short may be detected because there is now twice as much capacitance coupling the test signal to the capacitive sensor. This results in an unusually strong detection signal, which may be detected as a short. Second, if the non-probed pin is strongly driven to a fixed level by its internal driver or by other circuitry to which it is connected, and thus decreases the signal level of the AC test signal driven into the pin, then the short may be detected because of the decreased signal coupled to the capacitive sensor. However, the defect would probably be diagnosed as an open pin rather than as a short.

More specifically, if pin 401.1 is tested by means of a test signal applied to it by an external signal source, the short may be detected by the capacitive sensor at IC 401 because of the unusually large or small detection signal. However, in the prior art the capacitive sensor cannot identify the other shorted node, and may not detect the short at all due to the fairly small (typically 2 to 3 dB) difference in signal level between a non-shorted and a shorted node. Because the difference in signal level is close to the expected variability in measurements of good PCBs it is difficult to set detection limits which reliably detect shorts without simultaneously rejecting good PCBs. Also because of the small difference in signal level, the algorithms or other measuring means used to measure the signal level at 401 must be fairly accurate. In the prior art the capacitive sensor at IC 403 is not enabled during the test of IC 401, so it can neither detect the short nor provide additional information which could be used to identify the shorted nodes.

An inherent difficulty with this test method is that the decreased signal level due to the driven pin 401.2 may be masked by the increased capacitance, making detection of this fault unreliable. Also, capacitive testing cannot determine which nodes are shorted—it can only determine that the short involves one pin located under the capacitive sensor (the pin currently under test), and the other node(s) being one (or more) of the non-probed nodes on this PCB.

Yet another limitation of capacitive testing is evident with reference to the faulty circuit depicted in FIG. 5. More particularly, FIG. 5 is a diagram illustrating another type of short between nodes on a PCB. In FIG. 5 IC 501 and IC 502 each have a capacitive sensor (not shown) positioned proximate to them so as to detect any test signal coupled to a node associated with that IC. There is a short between IC 501 pin one (501.1) and IC 501 pin 2 (501.2), and neither 501.1 nor 501.2 can be accessed by a test probe.

Without probe access to 501.1 and 501.2, these pins may not be tested by an external signal source.

If IC 501 is used as an onboard controllable signal source for testing pins 501.1, 501.2, 502.1, and 502.2, then the short may be detected by the increased signal level at the capacitive sensors positioned proximately near IC 501 and IC 502. However, because of the variability in output signal level of the onboard controllable signal source from one PCB to another and the desire to set detection limits which do not cause a false detection of shorts, the tester may fail to detect the short. Similarly, the short depicted in FIG. 6 would not be detected by capacitive sensors, whether in conjunction with an onboard or external signal source, because the sensors at IC 603 and IC 604 would not be enabled or examined while testing IC 601 and IC 602.

In summary, for detecting shorts between devices mounted on a populated printed circuit assembly, there is a need for a system that: (1) improves the capacitive testing method to allow detection of shorts between pins without physically probing the pins (2) allows testing without probing a signal path connected to the pins (3) reduces the required number of test point access nodes on the printed circuit assembly (4) allows detection of shorts where there is only one device on the printed circuit assembly implementing Boundary Scan or where a Boundary Scan device is surrounded by other devices that do not implement or support Boundary Scan testing; (5) allows the cooperative use of both external and onboard controllable signal sources for maximum circuit coverage; and (7) allows the shorted nodes to be identified without probe access.

SUMMARY OF THE PRESENT INVENTION

The present invention satisfies the above described needs by providing an improved method and apparatus for detecting manufacturing defects, including shorts and opens, between devices mounted on a printed circuit board as part of a printed circuit board assembly. The present invention allows for detection of shorts between nodes, even when there is limited probe access to the nodes themselves or to signal paths related to the nodes.

Briefly described, the present invention includes an apparatus and a controllable signal source which provides an output test signal which is delivered to the PCB by probes or other equivalent means. The controllable signal source may be integral to the PCB ("onboard") or external to the PCB. The external controllable signal source may be the signal source provided by a conventional in-circuit tester for capacitive opens testing. Additionally, an embodiment of the present invention includes a plurality of capacitive sensors disposed proximate to the PCB so as to detect signals from the maximum possible number of wire traces, pins, and circuit nodes.

The onboard controllable signal source may be part of the printed circuit assembly and is preferably implemented as part of the normal functional circuitry of the circuit assembly. For example, the onboard controllable signal source may be a microprocessor, a microprocessor-based integrated circuit, an oscillator, an FPGA or ASIC, or an IC supporting the previously described Boundary Scan testing methodology.

The controllable signal source generates the test signal at a predetermined frequency. The predetermined frequency of the test signal is preferably harmonically unrelated to the frequency of any other signal associated with the device. This lack of harmonic relation helps to avoid false detection of shorts. An electrical signal path connects the output of the controllable signal source to the pin to be tested. Preferably, this signal path is the same path that implements the normal function of the device during normal operation of the circuit assembly. The onboard controllable signal source is therefore able to apply the test signal to the pin without having to probe the electrical signal path or the pin.

Sensors for detecting the test signal from the pin, such as capacitive sensors, are positioned proximately near the pin and other devices on the circuit assembly so the sensors can detect the amplitude of the test signal at various locations on the assembly. The sensors then relay the amplitude of the test signal to a detector for comparison of the detected amplitudes to predetermined and prerecorded threshold values. Comparison of the detected amplitudes to the predetermined threshold values indicates the presence or absence of a fault such as a short. In other words, the comparison indicates whether the devices in the circuit assembly are properly interconnected.

Importantly, the test signal generated by the controllable signal source has a selectable frequency. The value of the selectable frequency is harmonically unrelated to a frequency of any other signal associated with the device.

The electrical signal path connects the controllable signal source with the pin on the device. Thus, the controllable signal source generates the test signal at a predetermined amplitude and applies the test signal to the pin via the electrical signal path. If the onboard controllable signal source is used, then the signal is applied without probing the signal path. If the external controllable signal source is used, then the signal is applied to the signal path by a probe or other means.

In general, sensor assemblies in accordance with embodiments of the present invention capacitively detect the applied test signal at the pin and at any other places where the signal may appear on the PCB. Sensor assemblies include a sensor and a controller, such as a conventional computer used with an in-circuit tester. The sensors, preferably capacitive sensors, are positioned at a plurality of locations on the PCB so as to sense signals from the maximum possible number of wire traces, pins, and circuit nodes.

The method of the present invention may begin by selecting the selectable frequency of a test signal. The value of the selectable frequency depends upon the frequency of any other signal associated with the device in that the selectable frequency is harmonically unrelated to a frequency of any other signal associated with the device. The selectable frequency may be selected at any step in the process prior to detection of the test signal. For example, the frequency could be selected at the time the test signal is generated by adjusting the frequency of a control oscillator on the PCB. Alternatively, it could be selected by adjusting the CLOCK frequency applied to a Boundary Scan port. In another alternative, it could be selected at the time the PCB is designed by the choice of microprocessor instruction codes programmed into an on-board memory on the PCB.

The method then requires generating the test signal (having a selectable frequency) from the controllable signal source. The test signal is applied to a pin. The amplitude of the test signal is detected at a plurality of locations on the PCB. This detected amplitude is generally referred to as a "detection signal", which is then provided to a programmable controller. Finally, the value of each detection signal is compared to one or two threshold values. The comparison of the value of the detection signal to the threshold values is indicative of whether there is a short to the pin.

Furthermore, the step of detecting the amplitude of the test signal, i.e., the detection signals, may include detecting the detection signals using capacitive sensors positioned proximately near the pin and the maximum possible number of additional wire traces, pins, and circuit nodes.

Another embodiment of the present invention includes an improved method for identifying nodes which are shorted together, even if one or both of the nodes do not have probe access. This improved method preferably begins with the detection of the first of a pair of shorted nodes by means of a capacitive sensor. The nodes which cannot be probed but which can be tested by means of controllable signal source are then placed into a node list. From this list nodes are selected, and are driven to their highest state or voltage level while the first node is retested. The selected nodes are then driven to their lowest state or voltage level while the first node is retested. While these tests are run, the remaining nodes are preferably left in an idle, non-driven, or floating state. When the second of the shorted nodes is driven to one or both of its states, the detected signal level will drop significantly, compared to the signal level when that node is floating or is in the other state. This difference in signal level is used to identify when the second of the shorted nodes is driven. The process is then repeated with a different selection of driven nodes until the second of the shorted nodes is identified.

In an alternative embodiment, the selected nodes are driven to their state of maximum drive capability (in a digital system, the state of maximum fan-out) while the first node is retested.

In yet another embodiment, the selected nodes are driven to the state that was determined to be optimum for that device type, by testing that device type by using induced faults on known-good boards.

Driven nodes may be selected at random or by other means, such as weighting based on physical proximity to the first shorted node. For example, the second of the nodes might be found by a binary search, in which half of the nodes are chosen to be driven and half left floating. If the detected signal level drops when these nodes are driven, then the second of the shorted nodes is among those being driven. The list of floating nodes is then discarded, and the list of driven nodes is again divided in half. The process continues until only the second of the shorted nodes remains.

In an alternate embodiment, the driven nodes are driven out of phase with the output signal of the controllable signal source.

The present invention also includes an improved method for detecting shorts between pins of the same device, where one or both pins do not have probe access. This has, historically, been difficult because the difference in detected signal level is relatively small compared to the standard deviation of measurements from one PCB to the next. The method of the present invention comprises the steps of measuring the signal level of the onboard controllable signal source by probes on a few of its pins, or by a capacitive sensor positioned proximately near the signal source, or both, and then using the measured signal level to predict the signal level at the device under test. Because this reduces the uncertainty associated with the measured signal at the device under test, it advantageously allows the use of tighter detection limits, without increasing the number of false short detections. Additionally, tightened detection limits can assist in testing for open pins.

In summary, the present invention (1) allows testing for shorts without physically probing the node; (2) allows testing for shorts without probing a signal path connected to the node; (3) reduces the required number of test points on the printed circuit assembly when attempting to test for shorts; (4) allows testing of a circuit where there is only one device on the printed circuit assembly implementing Boundary Scan and that device is surrounded by other devices that do not implement or support Boundary Scan testing; (5) allows the use of both external and onboard controllable signal sources for maximum circuit coverage; (6) allows detection of shorts when there is no probe access to one or both of the shorted nodes; and (7) allows the shorted nodes to be identified without probe access. These and other features, advantages, and aspects of the present invention may be more clearly understood and appreciated from a review of the following detailed description of the disclosed embodiments and by reference to the appended drawings and claims.

BRIEF DESCRIPTION OF THE DRAWINGS

FIG. 1 is a block diagram of a prior art system illustrative of boundary scan testing.

FIG. 2 is a diagram of a prior art system implementing capacitive testing for detecting open pins or shorted pins on a device.

FIG. 3 is a diagram of a predecessor system for testing the integrity of an electrical connection without having access to the electrical connection, on which the present invention is an improvement.

FIG. 4 is a diagram illustrating a faulty circuit, the diagram being useful for description of prior and present fault detection techniques.

DETAILED DESCRIPTION

The present invention is directed to an apparatus and method for detecting faults within electrical circuitry. Use of the improved apparatus and improved method of the present invention allows for detection of faults such as shorts and allows identification of the two shorted nodes, even when there is no probe access to one or both of the nodes, and no probe access to a signal path related to the nodes.

Figure 5:
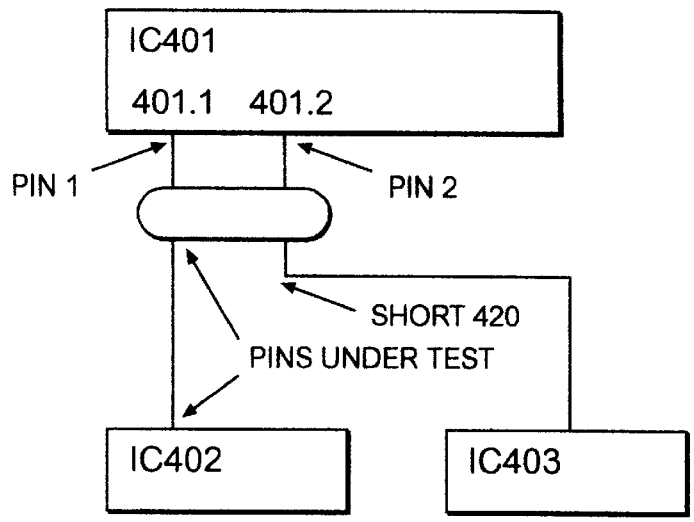
FIG. 5 is another diagram illustrating a faulty circuit, the diagram being useful for description of prior and present fault detection techniques.
Figure 6:
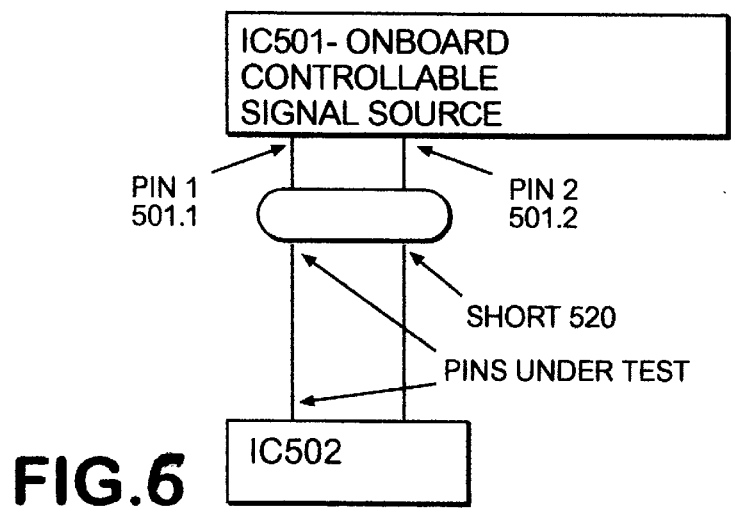
FIG. 6 is yet another diagram illustrating a faulty circuit, the diagram being useful for description of prior and present fault detection techniques.

With reference to FIGS. 4 through 10, in which like numerals represent like elements throughout the several figures, the preferred embodiment, and the various aspects of the present invention are described. As previously described, FIGS. 4–6 depict a variety of shorts within different circuit configurations. FIGS. 7–10 depict exemplary steps for operation of an exemplary embodiment of the present invention.

Turning to the faulty circuit depicted in FIG. 4, the present invention may be accomplished by positioning capacitive sensors (not shown) proximately near ICs 401, 402, and 403 so that the capacitive sensors may detect any test signal coupled to a node associated with the respective IC. The positioning of such capacitive sensors is well known to those skilled in the art. In the example depicted in FIG. 4, there is a short between IC 401 pin one (401.1) and IC 401 pin 2 (401.2). In this example, pin 401.2 has no probe access.

In an embodiment of the present invention, pin 401.1 is tested by a test signal applied to it by an onboard controllable signal source, such as that which has been previously described, or by an external signal source. The short may be detected by the capacitive sensor positioned proximately near IC 403 in a manner also previously described. When the test signal is applied to pin 401.1, whether by an onboard or external signal source, the capacitive sensors at IC 401 and IC 402 will both produce a detection signal indicating that a connection exists between the signal source and the appropriate pins 401.1 and 402.1. However, the capacitive sensor proximate to IC 403 will also detect the signal at a level above the detection threshold, thus indicating that an unexpected and inappropriate connection (a short) exists between pin 401.1 and a node associated with IC 403. Because the test signal is not expected to appear at IC 403, the difference in signal level between a good (non-shorted) PCB and a shorted PCB will be very large (typically 10 to 20 dB), thus allowing easy differentiation between a non-shorted and a shorted PCB.

In the preferred embodiment, all capacitive sensors are examined for a detection signal and a short is declared if the test signal appears at any unexpected location. It is advantageous to place capacitive sensors proximately near as many components as possible, even if those components can be otherwise tested. Because the signal level at IC 403 does not need to be measured accurately in order to detect the short, it may be advantageous to use algorithms or other signal measuring systems at IC 403 which are less accurate, but perhaps faster than those used at IC 401.

Still referring to FIG. 4, pin 401.1 is tested by application of a test signal applied to it by either an onboard controllable signal source or by an external signal source. The short is detected by the capacitive sensor positioned proximately near IC 403 because no signal is expected at IC 403 based solely on application of the test signal to pin 401.1. The capacitive sensor at IC 403 will detect the signal at a level well above the predetermined lower detection threshold level, thus indicating that an unexpected and inappropriate connection (a short) exists between pin 401.1 and a node associated with IC 403. Because there are no common nodes between IC 403 and pin 401.1, the difference in signal level between a good (non-shorted) PCB and a shorted PCB will be very large (typically 10 to 20 dB).

The test apparatus then attempts to identify the shorted nodes by driving some nodes which are controllable by onboard controllable signal sources to a known state while floating, tri-stating, or driving to the opposite state the remaining nodes. Although such floating and tri-stating may often be desirable, it may not always be possible. Thus, insignificant changes in the testing methodology are made in accordance with the disclosure herein and techniques well known in the art. When the shorted node (pin 401.2) is driven to a known state, the signal level detected at IC 401, IC 402, and IC 403 will decrease (when compared to the state when pin 401.2 is not driven, or is driven to the other state). This drop in signal level when driving pin 401.2 identifies the shorted nodes as being pins 401.1 and 401.2 (driven by either an external signal source or an onboard controllable signal source). Thus the present invention advantageously combines multiple capacitive sensors with external and onboard signal sources to detect shorts and identify the nodes which are shorted together.

Referring now to FIG. 5, where pin 501.1 is being tested by an onboard controllable signal source, the short 520 may be detected by the increased signal level at both IC 501 and IC 502. Unlike prior art methods of testing, in which tests of IC 501 and IC 502 treated the respective ICs as independent and unrelated, an embodiment of the present invention combines the information from both tests to improve the reliability of detection of shorts.

Pins 501.1 and 501.2 are tested by an onboard controllable signal source IC 501. Because of variability in the manufacturing process (particularly that of the semiconductors implementing the onboard controllable signal source) the signal level of the onboard controllable signal source varies somewhat from PCB to PCB. The present invention measures the signal level of the onboard controllable signal source IC 501 at a few selected pins of IC 501 by conventional probes probing a trace connected to the pins, then uses these measurements to predict the signal level at pin 501.2. The prediction is made by implementation of a prediction equation created from measurements of known-good PCBs, using techniques which are well known to those skilled in the art of statistics. More specifically, information on prediction equations can be found in references such as "STATISTICS FOR BUSINESS AND ECONOMICS", by James T. McClave and P. George Benson, published in 1988 by Dellen Publishing Company, which is incorporated herein by reference. It is advantageous to make the measurements at an output pin having the same drive characteristics as pin 501.1. That is, if there is more than one type of output driver in 501, measurements of one type will correlate more directly with pins of the same type than with pins using the other type of driver.

As discussed in the '953 patent, a predicted signal level must be adjusted to allow for the varying geometry of the several pins of IC 502. Because signal strength of the onboard controllable signal source IC 501 is measured for each PCB, the expected standard deviation of the measurements at pin 502.1 is reduced and the upper and lower detection limits may be advantageously brought closer together without causing an increase in the number of falsely detected shorts or opens. Because of the short between pin 501.1 and pin 501.2, and the advantageously narrowed detection limits, the detected signal level at either or both 501 and 502 is larger than the upper detection threshold and the short is detected.

In an alternative embodiment, a prediction equation is created for each pin of IC 502, thus allowing the prediction equation to compensate for the varying geometry (and consequently varying signal level) of the pins of IC 502.

In another embodiment, the measurements at IC 501 may be made by one or more capacitive sensors proximately near IC 501.

In yet another embodiment, the measurements at IC 501 may be made by a combination of capacitive sensors proximately near IC 501 and by probes. The signal level at IC 502 is predicted from both sets of measurements. Optionally, measurements could be made at points other than IC 501 in a situation in which only one capacitive sensor is being used and all pins whose input will be fed to the prediction equation connect to that point.

Referring now to FIG. 6 an embodiment of the present invention detects the short by examining the capacitive sensors at IC 603 and IC 604 while testing pin 601.1 and pin 602.1. The sensors at both IC IC 603 and IC 604 would detect the signal at a level well above the lower (and only) detection limit, thus reliably indicating the presence of a short. Even if neither IC 603 nor IC 604 is testable by an onboard controllable signal source, an indication of the shorted nodes may still be obtained. Since the short affects a node common to IC 603 and IC 604 (if only one short is assumed) then an examination of the PCB geometry will narrow the list of likely shorted nodes to those that are both common to IC 603 and IC 604, and located sufficiently near pin 601.1 to be easily shorted. Thus the present invention advantageously combines information from multiple capacitive sensors to narrow the list of possible shorted nodes.

Figure 7:
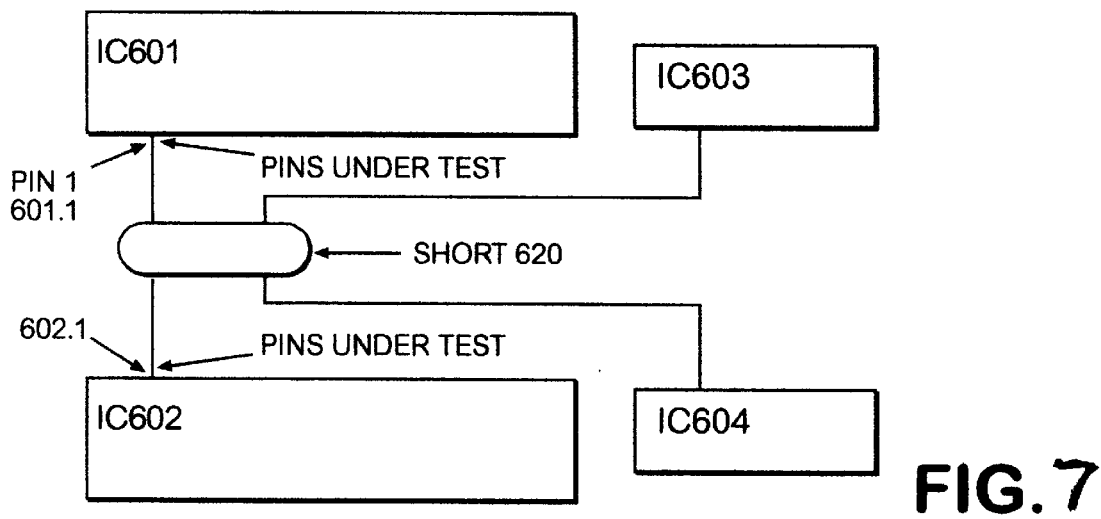
FIG. 7 is a flow diagram illustrating the steps for detecting the short from FIG. 4.

FIG. 7 is a flow diagram illustrating the preferred steps for detecting a short such as that which is illustrated in FIG. 4. Referring now to FIG. 7, the method 700 begins at step 710 where a test signal is applied to pin 401.1 by either an external or an onboard controllable signal source.

At step 715 the signal level is measured at one of a plurality of capacitive sensors, other than the sensors at IC 401 and IC 402. At step 720, if the detected signal level is above a predetermined detection threshold, then a short exists between pin 401.1 and a node proximately near the currently selected capacitive sensor. This is indicated at step 725. It is assumed that pin 401.1 is connected only to pin 402.1. In the general case, step 715 will test the signal level at all of the capacitive sensors other than those which are proximately near the node connected to 401.1. Now continuing to step 730, if some of the capacitive sensors not proximately near the node connected to pin 401.1 have not been tested, then the depicted method returns back to step 715 to measure the signal level at any untested capacitive sensor. If all of the capacitive sensors not proximately near the node connected to pin 401.1 have been tested, then the method is completed at step 740.

Figure 8:
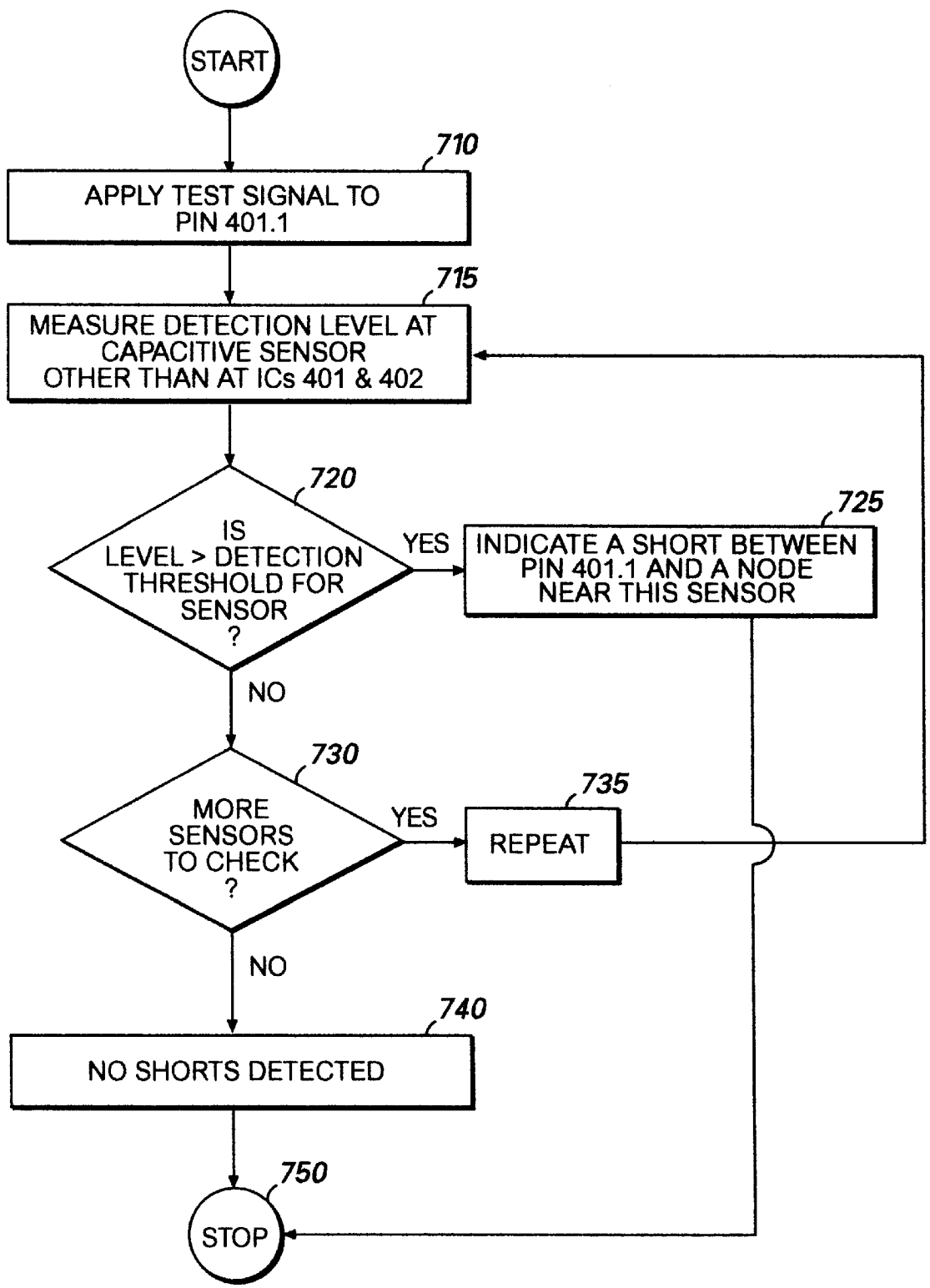
FIG. 8 is a flow diagram illustrating the steps for detecting the short from FIG. 5.

FIG. 8 is a flow diagram illustrating the steps for detecting a fault such as a short in the circuit depicted in FIG. 5, or other similar fault where it is advantageous to use tighter detection limits without increasing the number of falsely detected faults. Referring now to FIG. 8, the method 800 begins and, at step 810, all probed pins are tested using conventional bed-of-nails test techniques. At decision block 820, if a short is detected, the test is stopped at step 822, the presence of the short is indicated at step 824 and the test ends at step 890. If, on the other hand, no short is detected, a test signal is generated on a single pin of an IC such as IC 501 and measured via a probe on that particular pin.

Next, a test signal is generated on a different pin of IC 501 and similarly measured by a probe on that particular pin. At decision block 850, the generation of test signals on different pins continues until test signals have been generated on a predetermined number of pins. Once the predetermined number of pins has been reached, a list of all possible pairs of pins is created at step 860. Thereafter, a comparison is performed to evaluate differences in measurements as between pairs of pins to a maximum difference expected between pins. At decision block 870, if the measurement of any particular pair of pins differs by more than the expected difference, there is an indication of a probable short, so the method of the present invention returns to steps 820 wherein the short has been detected, the test is stopped at step 822, the short is indicated at step 824, and the test ends at step 890. If the difference between pins, on the other hand, is not greater than the expected difference, the signal level from all the pins measured in steps 830 and 840 is incorporated into the prediction equations to increase the reliability and accuracy of subsequent tests for shorts and opens using the prediction equations. Thereafter, the method depicted in FIG. 8 concludes at step 890.

Figure 9:
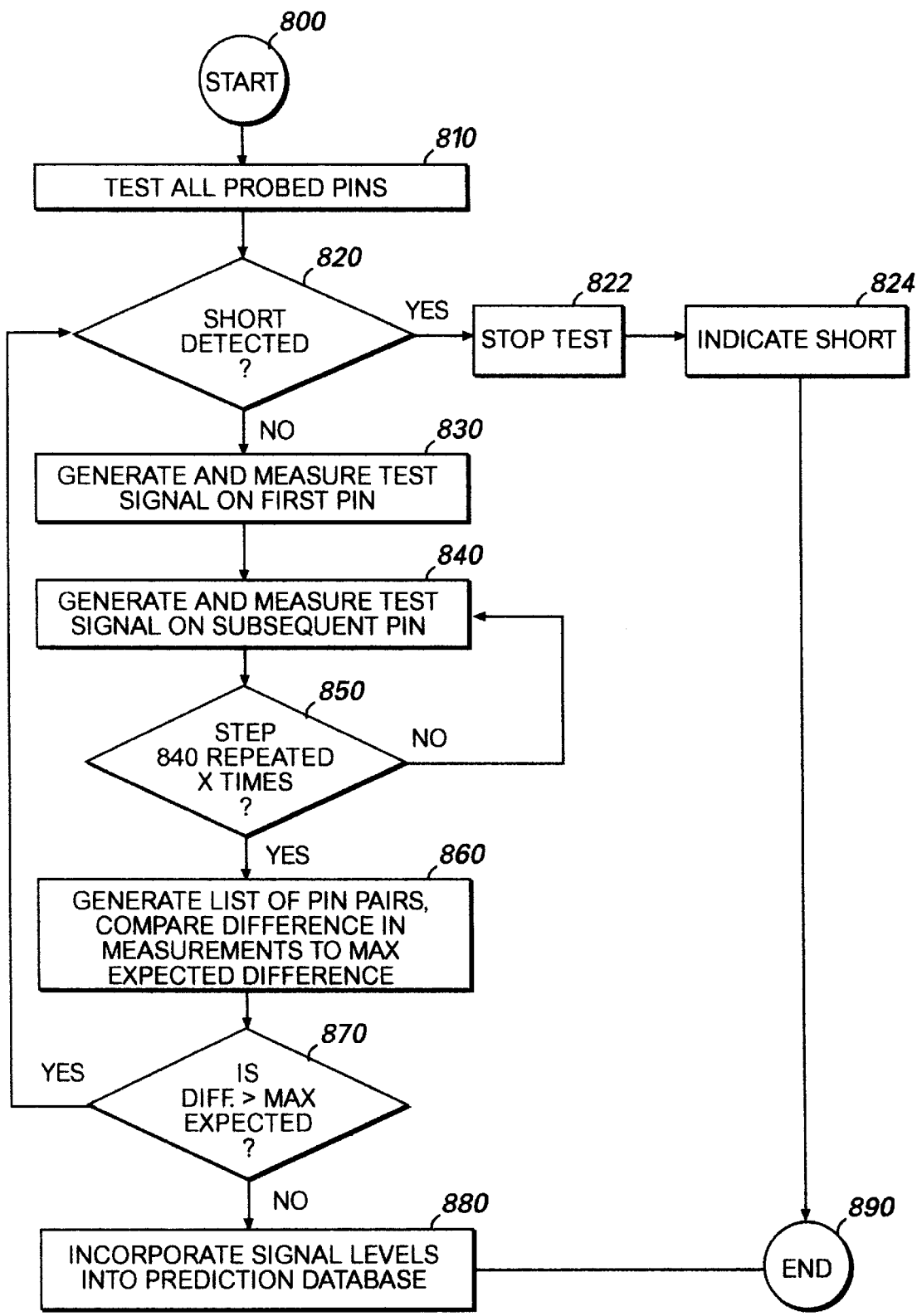
FIG. 9 is a flow diagram illustrating alternative steps for detecting the short from FIG. 5.

In an alternative embodiment, the onboard controllable signal source may be measured by means of the capacitive sensor at IC 501, rather than by means of probes. This method is illustrated in FIG. 9. Referring now to FIG. 9, the method begins at step 900 and, at step 910, a test signal is generated on a signal pin of IC 501 and measured via the capacitive sensor positioned approximately near IC 501. At step 920, a test signal is generated on second pin of IC 501 (preferably not adjacent to any previously used pin) and measured via the capacitive sensor at IC 501. The preference for non-adjacent pins serves to reduce the probability of shorts between any of the chosen pins in a well known manner. At decision block 930, an inquiry is made as to whether a predetermined number of repetitions of test signal generation and capacitive sensor measurements has been performed. If not, the method returns to step 920. If, on the other hand, sufficient repetitions have been accomplished, the method moves to step 940 where a list is made of all possible pairs of pins used in steps 910 and 920. Thereafter, at step 945, a comparison is performed of the difference in measurements for each pair of pins as compared to the maximum difference expected. The maximum difference expected may be based on measurements of one or more known good boards, using statistical techniques that are well known in the art. If, at decision block 950, the measured difference is greater than the expected difference, a short is indicated at step 955 and the test is stopped at step 999. If, on the other hand, the measured difference was not greater than the expected difference, the measurements are incorporated, at step 960, into the prediction database for improvement of later measurement comparisons.

Figure 10:
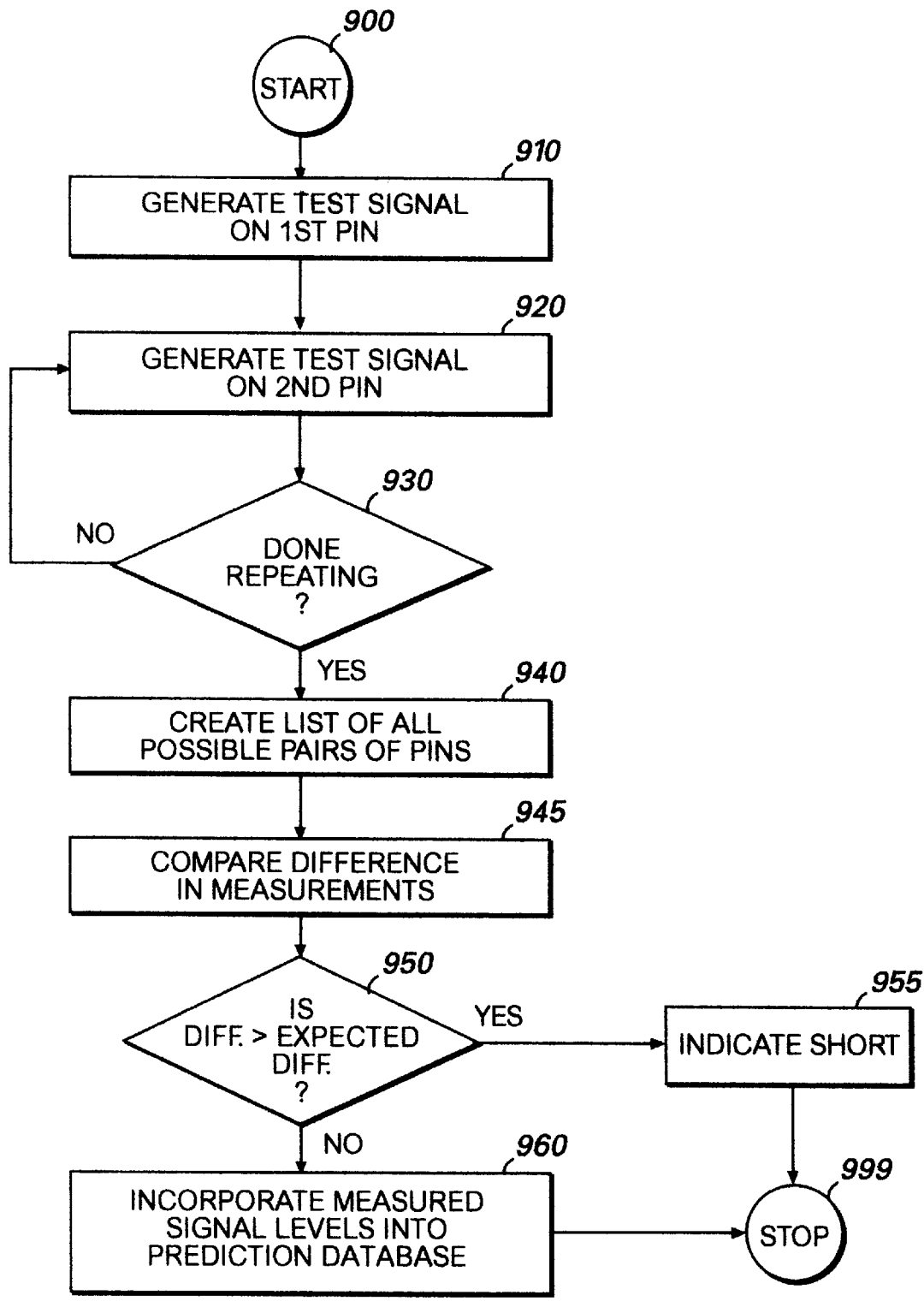
FIG. 10 is a flow diagram illustrating the steps for identifying the shorted nodes.

The present invention also includes an improved method for identifying a specific shorted node. Referring now to FIG. 10, the method begins at step 1000 and at step 1005, a list of possible nodes is created or accessed, as previously discussed. At step 1010, a node is selected from the node list and, at step 1015, the node is floated or tri-stated and the test which first indicated the short is repeated on the known short at Pin "X", as depicted in step 1020. Thereafter, a selected node is driven to its maximum positive value at step 1025. While the selected node is being driven to its maximum positive value, the test is repeated at the known short at Pin "X", shown at step 1030. At step 1035, the selected node is driven to its maximum negative value and, at step 1040, the test is repeated on the known short at Pin "X".

At step 1045, test results from measurement steps 1020, 1030 and 1040 are compared. If the compared signal levels differ significantly, as shown at decision block 1050, the test is stopped at step 1055 and the method ends at step 1060. If the test results do not differ significantly, another node is selected from the node list at step 1010 and the process is repeated until the location of the short is detected or until the list of nodes is exhausted.

Importantly, although FIG. 10 illustrates selecting and testing one pin at a time, it is specifically contemplated that the scope of the present invention includes selecting and testing multiple pins at once, using techniques such as a binary search, which is well known in the art.

From the foregoing description, it would be appreciated that the present invention provides an improved apparatus and an improved method for detecting shorts on a printed circuit assembly using a combination of external and onboard controllable signal sources. The foregoing systems and method may be conveniently implemented based on the figures and accompanying description herein. The present invention has been described by particular embodiments which are illustrative rather than restrictive. Those skilled in the art will understand that the principles of this invention apply to any apparatus or process that must efficiently detect shorts on a printed circuit assembly.

Alternative embodiments will become apparent to those skilled in the art to which the present invention pertains without departing from its spirit and scope. Accordingly, the scope of the present invention is defined by the appended claims.

What is claimed is:

1. An apparatus for detecting the presence of, and then locating the position of a manufacturing defect on a populated circuit board, comprising:

at least one signal source from a group of signal sources including an onboard controllable signal source and an external controllable signal source, the signal source being responsive to a control signal, the control signal triggering generation of an output test signal from the signal source and application of the output test signal to an electrical signal path on the populated circuit board; and a sensor assembly for detecting the output test signal proximately near a location on the circuit board, the location being electrically unrelated to the electrical signal path to which the test signal is applied, the sensor being further functional to detect the manufacturing defect by comparing the output test signal detected proximately near the location on the circuit board to a lower threshold value, the sensor assembly being separate from the circuit board.

2. An apparatus for detecting the presence of, and then locating the position of a manufacturing defect on a populated circuit board, comprising:

an onboard controllable signal source, responsive to a control signal, the control signal triggering generation of an output test signal from the signal source and application of the output test signal to an electrical signal path on the populated circuit board;

a first sensor assembly for detecting the output test signal proximately near a location on the circuit board, the location being electrically connected to the electrical signal path to which the output test signal is applied, the first sensor assembly being further functional to detect the manufacturing defect by comparing the output test signal detected proximately near the location on the circuit board to a predetermined level, the first sensor assembly being separate from the circuit board; and a measuring device to measure a signal level of the output test signal generated by the signal source, the measuring device including at least one sensor from the group of sensors comprising: a probe for probing a test point connected to an output of the signal source and a second sensor assembly for detecting the output test signal at a point proximately near the signal source.

3. The apparatus of claim 2, wherein the predetermined level is determined by a prediction equation.

4. The apparatus of claim 2, wherein the predetermined level includes a higher threshold value and a lower threshold value.

5. The apparatus of claim 2, wherein the predetermined level includes a higher threshold value.

6. The apparatus of claim 5, wherein the predetermined level is determined by a prediction equation.

7. An apparatus for detecting the presence of, and then locating the position of a manufactured defect on a populated circuit board, comprising:

at least one signal source from a group of signal sources including an onboard controllable signal source and an external controllable signal source, the signal source being responsive to a control signal, the control signal triggering generation of an output test signal from the signal source and application of the output test signal to an electrical signal path on the populated circuit board; and a sensor assembly for detecting the output test signal proximately near a location on the circuit board, the location being electrically connected to the electrical signal path to which the output test signal is applied, which signal path is the first shorted node, the apparatus then identifying a second shorted node by comparing the output test signal detected proximately near the location to a predetermined value, the sensor assembly being distinct from the circuit board.

8. The apparatus of claim 7, further comprising a measuring device to measure a signal level of the output test signal generated by the onboard signal source, the measuring device including at least one sensor from the group of sensors comprising: a probe for probing a test point connected to an output of the signal source and a second sensor assembly for detecting the output test signal at a point proximately near the signal source.

9. The apparatus of claim 7, wherein the predetermined level includes a higher threshold value.

10. The apparatus of claim 7, wherein the predetermined level includes a higher threshold value and a lower threshold value.

11. The apparatus of claim 7, wherein the predetermined level is determined by a prediction equation.

12. The apparatus of claim 11, wherein the prediction equation compensates for a plurality of varying geometries of a corresponding plurality of pins of a device being tested.

13. A method for detecting the presence of, and then locating the position of a manufacturing defect on a populated circuit board, comprising the steps of:

a. in response to receiving a control signal, a controllable signal source generating an output test signal;

b. applying the output test signal to an electrical signal path on the populated circuit board; and c. detecting the output test signal by a sensor assembly, the sensor assembly being positioned proximately near a location on the circuit board, the location being electrically unrelated to the electrical signal path to which the output test signal is applied; and d. comparing the output test signal detected proximately near the location on the circuit board to a threshold value.

14. A method for detecting the presence of a manufacturing defect on a populated circuit board, comprising the steps of:

a. in response to receiving a first control signal, an onboard controllable signal source generating and providing an output test signal to one or more pins of the onboard controllable signal source;

b. measuring the output test signal at or proximately near each pin of the onboard controllable signal source;

c. in response to receiving a second control signal, the onboard controllable signal source generating an output test signal to a single pin;

d. applying the output test signal to an electrical signal path on the populated circuit board;

e. detecting the output test signal by a sensor assembly, the sensor assembly being positioned proximately near a location on the circuit board, the location being electrically connected to the electrical signal path to which the output test signal is applied; and f. comparing the output test signal detected proximately near the location on the circuit board to a threshold value, the sensor assembly being separate from the circuit board, the comparison determining conformity between detected test signal values and an expected test signal value.

15. The method of claim 14, wherein the comparing step comprises the further step of determining conformity between detected test signal values and an expected test signal value determined by application of a prediction equation.

16. A method for locating the position of a manufacturing defect on a populated circuit board, comprising the steps of:

a. identifying a known shorted pin;

b. creating a list of possible shorted nodes;

c. selecting a first node from the list of possible shorted nodes;

d. testing the known shorted pin and recording a first test level;

e. driving the first node to both a maximum positive and then to a maximum negative level, measuring after each the respective second and third test levels of the known shorted pin; and f. comparing the first, second and third test levels to each other and, if a difference between test levels exceeds a predetermined maximum difference, indicating a short, otherwise selecting a second possible shorted node from the list of possible shorted nodes and repeating steps (d)–(f) until the short is located.

17. The method of claim 16, where a plurality of nodes are selected and driven while testing the known shorted pin.

* * * * *